United States Patent [19]

Wood

[11] Patent Number: 4,684,924
[45] Date of Patent: Aug. 4, 1987

[54] ANALOG/DIGITAL CONVERTER USING REMAINDER SIGNALS

[76] Inventor: Lawson A. Wood, 905 N. Frederick St., Arlington, Va. 22205

[21] Appl. No.: 429,198

[22] Filed: Sep. 30, 1982

[51] Int. Cl.[4] .............................................. H03M 1/14
[52] U.S. Cl. .......................... 340/347 AD; 340/347 M
[58] Field of Search ................... 340/347 AD, 347 M; 307/234, 471; 328/55, 56, 66; 377/56, 75

[56] References Cited

U.S. PATENT DOCUMENTS

| | | | |
|---|---|---|---|
| 2,569,927 | 10/1951 | Gloess et al. | 340/347 AD |
| 2,950,469 | 8/1960 | Raasch | 340/347 AD |
| 3,188,624 | 6/1965 | McMillian | 340/347 AD |
| 3,425,054 | 1/1969 | Cowan | 340/347 AD |
| 3,566,265 | 2/1971 | Reid | 340/347 AD |
| 3,585,631 | 6/1971 | McCown | 340/347 AD |
| 3,597,761 | 8/1971 | Fraschilla | 340/347 AD |
| 3,710,377 | 1/1973 | Guillen et al. | 340/347 AD |
| 3,878,533 | 4/1975 | Kleiner et al. | 340/347 AD |
| 3,891,984 | 6/1975 | Kerwin et al. | 340/347 AD |
| 4,072,938 | 2/1978 | Buchanan | 340/347 AD |

FOREIGN PATENT DOCUMENTS 7405875  9/1975  France .......................... 340/347 AD

Primary Examiner—Parshotam S. Lall
Assistant Examiner—Thomas G. Black
Attorney, Agent, or Firm—Spencer & Frank

[57] ABSTRACT

A fast A/D converter using a series of A/D modules, each of which determines one or more bits of the total digital output and generates a remainder signal which serves as the input signal for the next modules in the series. In each module, one or more comparators compare the input signal to one or more predetermined bias potentials. The output of the comparators is used to generate the digital output of the module. The output of the comparators is also used to operate switches which apply either zero or the highest bias potential which does not exceed the input signal to a subtraction circuit. The subtraction circuit finds the difference between the input signal and the selected bias potential. In one embodiment this difference can be used as the remainder signal for the next module, or the difference can be multiplied before being used. Several circuits for avoiding output ripple are also disclosed.

In another embodiment, the remainder signals are repeatedly recirculated through the same A/D module.

47 Claims, 12 Drawing Figures

ANALOG/DIGITAL CONVERTER USING REMAINDER SIGNALS

BACKGROUND OF THE INVENTION

The present invention relates to an analog/digital converter, and more particularly to a fast A/D converter which uses remainder signals for determining some of the bits.

Many important signal sources produce their signals in analog, or continuously varying, form. Examples include the human voice or the output of a strain gauge. Analog signals must be converted to digital form before they are suitable for digital processing or digital communication. The speed with which this conversion takes place is an important factor, particularly if the analog signals have a high frequency, since the degree to which a digital signal can conform to its analog equivalent depends upon how frequently these conversions can be made.

Figure 1:
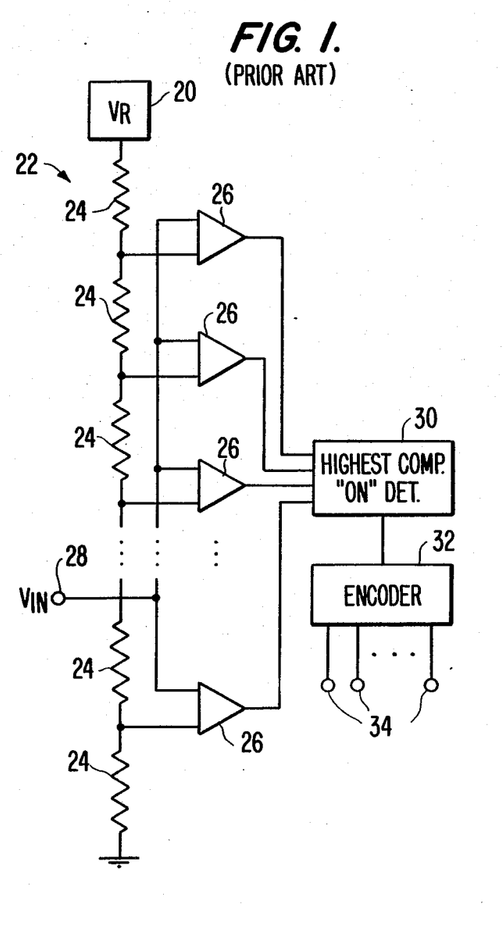
FIG. 1 is a schematic diagram illustrating the scheme used in a fast prior art A/D converter.

A number of schemes for converting analog signals to their digital equivalents have been developed. One such prior art A/D converter is illustrated in FIG. 1. In FIG. 1, a reference voltage source 20 supplies a reference voltage $V_R$ to a biasing network 22 in the form of a voltage divider made of series-connected resistors 24. Biasing network 22 provides progressively increasing bias potentials to one terminal of each of comparators 26. The remaining input terminals of comparators 26 are supplied in common with an analog voltage $V_{in}$ applied to input terminal 28. The output of each comparator 26 goes "high" if the analog input voltage equals or exceeds the bias voltage for that comparator. However, these outputs do not represent a binary word equivalent to the analog input voltage $V_{in}$. Instead, these outputs must be supplied to Highest Comparator "ON" Detector Circuit 30, which determines which comparator 26 is connected to the higest bias potential which does not exceed the analog input $V_{in}$. The result is then converted by encoder 32 into a multi-bit binary signal on output terminals 34.

It will be apparent to those skilled in the art that the circuit of FIG. 1 is incomplete, with missing components indicated by dots. That is, a large number of resistors 24 and comparators 26 must be used in order to achieve a digital output having a significant number of bits. In fact, in order to achieve a digital output word of n bits, $2^{n-1}$ comparators must be employed. The one great advantage of the circuit of FIG. 1 is that it is fast.

There exist prior art A/D converters which provide a relatively large number of output bits without using the excessive number of components of the system illustrated in FIG. 1. In the "dual-slope" converter, for example, an analog input voltage charges a capacitor while a clock signal is delivered to a binary counter. When the counter overflows the capacitor is then discharged at a constant rate, with the counter receiving clock pulses until the capacitor has completely discharged. As a result the final binary output of the counter will correspond to the original analog input voltage. However, A/D schemes which rely upon a clock in such a manner require a relatively long time to make the conversion. In the dual-slope converter, for example, the time required for the conversion is on the order of $2^{n+1}$ clock cycles. An eight-bit dual-slope converter would require 512 pulses for each conversion.

SUMMARY OF THE INVENTION

Accordingly, an object of the present invention is to provide a fast A/D converter without using an excessive number of components.

Another object of the present invention is to provide A/D modules which can be conveniently strung together to provide a converter of the desired word length.

Another object of the present invention is to provide an A/D converter using analog switches which supply a selected biasing potential to a subtraction circuit so that a remainder signal can be derived for a subsequent conversion.

Another object of the present invention is to provide a fast A/D converter which avoids output ripple as the signal propagates through the circuitry.

Another object of the present invention is to provide an A/D converter wherein the remainder signals can be recirculated through the same A/D module.

These and other objects of the invention can be obtained by using analog switches to select one out of a plurality of discrete biasing voltages which the analog input signal equals or exceeds. This biasing voltage is then subtracted from the analog input signal to provide a remainder signal that is used to further refine the digital output word.

BRIEF DESCRIPTION OF THE DRAWINGS

In the foregoing drawings, the same reference numbers are ocassionally used to illustrate the same components in different drawings.

DESCRIPTION OF THE PREFERRED EMBODIMENTS

Figure 2:
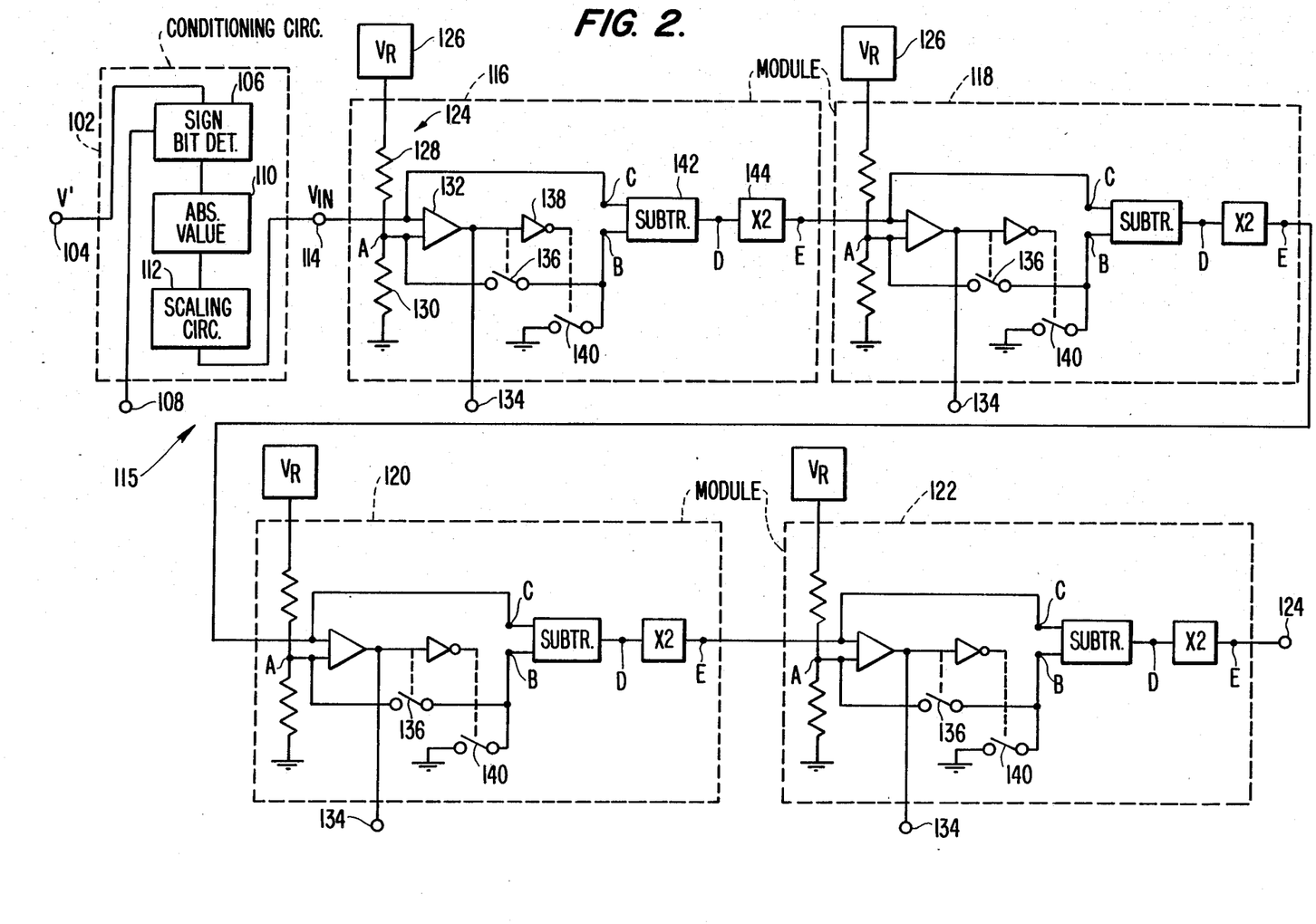
FIG. 2 illustrates an embodiment of the present invention using four A/D modules to form a four-bit converter.

FIG. 2 illustrates a four-bit A/D converter having an input conditioning circuit 102 which receives an analog signal V' at input port 104. Circuit 102 includes a sign bit extractor circuit 106 (such as a comparator) for determining whether the signal V' is positive or negative and providing an appropriate signal on sign bit terminal 108. Circuit 106 is connected to absolute value circuit 110, which changes negative signals into positive ones so as to achieve a signal having a single polarity. Scaling circuit 112 receives this signal and multiplies it by an appropriate factor before delivering it as analog signal $V_{in}$ to input terminal 114. The purpose of circuit 112 is to adjust the magnitude of the analog signal $V_{in}$ for subsequent conversion to digital form. Depending upon the magnitude of the signal V', this may entail either a reduction or an amplification, or possibly no modification at all. For some uses an input conditioning circuit 102 will be unnecessary; at any rate the analog signal $V_{in}$ will generally be used in lieu of the actual input signal V' in the ensuing discussions.

Four-bit A/D converter 115 is formed from four series connected A/D modules 116, 118, 120, and 122. Additional output bits could be obtained simply by connecting additional modules in series with remainder terminal 124 of the final module 122. Since these modules are identical, it is only necessary to explain the circuitry of the first module 116 in detail.

With continuing reference to FIG. 2, biasing network 124 in A/D module 116 is connected between ground and reference voltage source 126, which provides a reference voltage $V_R$. In module 116 the network 124 is formed by equal-valued serial-connected resistors 128 and 130, and accordingly the biasing potential at connection point A is $V_R/2$. This biasing potential is supplied to one input terminal of comparator 132, while the other input terminal receives the signal $V_{in}$. The output of comparator 132 is "high" (hereafter occasionally referred to as "1," even though this may not be its actual voltage) if $V_{in}$ equals or exceeds the potential at point A. On the other hand if the potential A exceeds $V_{in}$, the output of comparator 132 is "low" (hereafter occasionally referred to as "0"). Accordingly, either 1 or 0 is supplied to output bit terminal 134. Switch 136 is controlled by the output of comparator 132, and closes only if the output is 1. As will be apparent to those skilled in the art, this is not a mechanical switch but, instead, an electrical one. Suitable switches are known in the art and can be made, for example, from MOSFET transistors. Such switches are not rectifying, and have only a resistance component. As will become apparent hereafter, it is important to minimize the voltage drop across this switch. For this reason, it may be desirable in some applications to minimize the current through the switch by following it with a voltage-follower, which typically has an extremeley high input impedence. The voltage drop across the switch could also be reduced by employing a number of switches in parallel in order to reduce the "ON" resistance. Nevertheless, for the sake of simplicity, only the switch is illustrated here. With continuing reference to module 116 in FIG. 2, inverter 138 is connected to the output of comparator 132. The output of inverter 138 is used to operate switch 140 which, like switch 136, is electrical rather than mechanical. One side of each of switches 136 and 140 is connected to an input of subtraction circuit 142. Suitable circuitry is known in the art and may include, for example, a properly biassed difference amplifier. The remaining side of switch 140 is grounded, while the remaining side of switch 136 is connected to that point of biasing network 124 that has the potential $V_R/2$. In summary switch 136 is closed when the output of comparator 132 is 1, so that the potential at point B is the same as the potential at point A. On the other hand, when the output of comparator 132 is 0, inverter 138 closes switch 140 and the potential at point B becomes 0. The remaining input terminal of subtraction circuit 142 is connected to input terminal 114, so that the potential at point C is the same as $V_{in}$. Subtraction circuit 142 subtracts the potential at point B from the potential at point C, so that the potential at point D is $V_{in}$, if $V_{in}$ is less than the potential A, or $V_{in}$ minus the potential at point A, if $V_{in}$ is equal to or greater than $\frac{1}{2}$ of $V_R$. Multiplication circuit 144 multiplies this difference by 2 and provides an adjusted remainder term (hereafter simply the "remainder signal") at point E.

With continuing reference to FIG. 2, an example of the operation of A/D converter 115 will now be explained. Assume that input port 104 receives a signal that has an instantaneous value of, say, 13 volts (binary 1101). To receive an exact binary output corresponding to the input signal, the latter must be multiplied by a factor $M = V_R/2^n$, where "n" represents the number of output bits to be provided. Assuming $V_R$ is 10 volts for each of the four modules 116–122 in FIG. 2, the scaling factor $M = 10/16$. Accordingly, $V_{in}$ is 8.125 volts.

With continuing reference to FIG. 2, 8.125 volts exceeds the five volts at point A in module 116, so that the output at terminal 134 of module 116 becomes 1. Switch 136 in module 116 is closed, so that the potential at point B is 5 volts. Since the potential at point C in module 116 is 8.125 volts, the difference at point D in module 116 is 3.125 volts. After multiplication by 2, the remainder signal at point E in module 116 is 6.25 volts. This remainder signal is delivered to the next module 118. Switch 136 in module 118 is closed (and 1 appears at terminal 134) because the 6.25 input signal exceeds the 5 volt bias signal at point A. Accordingly, the potential at point B in module 118 becomes 5 volts, which is subtracted from the 6.25 volts at point C to obtain a voltage of 1.25 at point D. After multiplication by 2, the remainder signal at point E in module 118 becomes 2.5 volts. This value is supplied to the input of module 120. The output bit terminal 134 of module 120 is 0 because the 2.5 volt input signal is less than the five volts at point A. Switch 140 is closed, so that the potential at point B in module 120 is 0 volts. Thus, 0 volts is subtracted from the 2.5 volts at point C in module 20 to provide a 2.5 volt signal at point D. After multiplication by 2 this becomes 5 volts at point E in module 120. Finally, in module 122 the output at terminal 130 is 1, because the input to the module equals the five volts at point A. Switch 136 is closed, so that the signals at both points B and C are five volts. Accordingly, the remainder term at terminal 124 is zero. In summary, the original 13 volt analog signal provided at terminal 104 has, through scaling by the factor $M = V_R/2^n$, become 1101, the binary equivalent of the analog input (read from the output bit terminals 134 of modules 116, 118, 120, and 122, respectively). Those skilled in the art will understand that in many situations it is the binary representation rather than an exact binary equivalent of the analog input signal that is desired. In such situations the scaling factor M is not critical.

With continuing reference to FIG. 2, some general observations can be drawn. The comparator 132 in module 116 serves a single purpose, that is, to determine whether or not the voltage $V_{in}$ was less than the potential at point A. In contrast, due to the switching, subtracting, and multiplication in module 116, the comparator 132 in module 118 serves a dual function. If the voltage $V_{in}$ was less than five volts, the comparator in module 118 determines whether or not it was also less than 2.5 volts. On the other hand, if the voltage $V_{in}$ was greater than 5 volts, the comparator in module 118 determines whether or not it was also less than 7.5 volts. Similarly, the comparator 132 in third module 120 serves a fourfold purpose. Depending upon the voltage $V_{in}$, the comparator in module 120 determines whether or not the input voltage was less than 1.25 volts, 3.75 volts, 6.25 volts, or 8.75 volts. In short, for each successive module, the comparator(s) therein effectively replace a greater number of comparators in the prior art system of FIG. 1.

Figure 3:
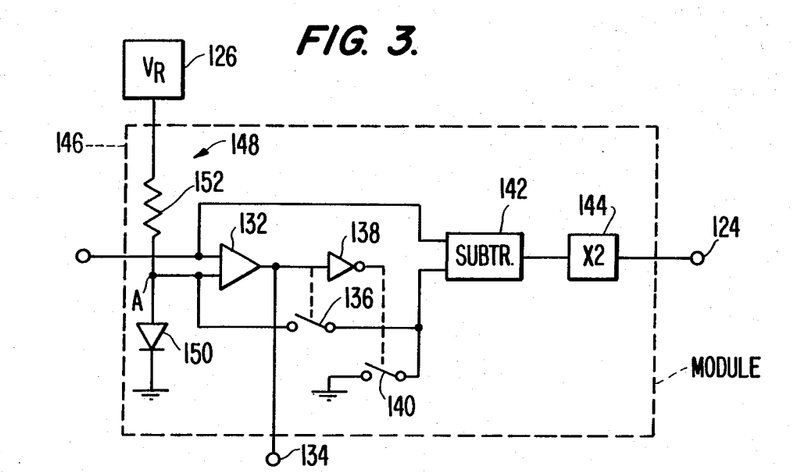
FIG. 3 illustrates an A/D module having a biasing network that employs a diode.

A number of alternatives can be used in lieu of resistors 128 and 130 to provide fixed biasing potentials for the comparators 132. For example, in FIG. 3 a biasing network 148 is provided in module 146. Module 146 relies upon a forward-biased diode 150 to bias comparator 132. Resistor 152 limits the current through diode 150.

Figure 4:
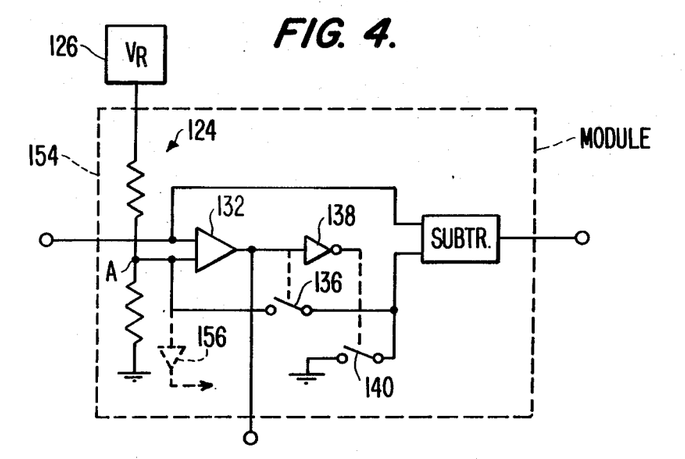
FIG. 4 illustrates an A/D module which avoids multiplication when providing the remainder signal by adjusting the reference voltage potential of the subsequent module.

A/D module 154 in FIG. 4 avoids the use of a multiplication circuit 144. This is accomplished by halving the reference voltage $V_R$ for each succeeding module. That is, if the reference voltage for the first module is 10 volts, the reference voltage for the second module would be 5 volts and the reference voltage for the third module would be 2.5 volts, etc. Since the potential at point A is $\frac{1}{2}$ of the potential $V_R$, a convenient way for deriving the subsequent reference voltages is to provide a buffer 156 connected to point A of every module in order to supply the reference voltage for the next module.

Figure 5A:
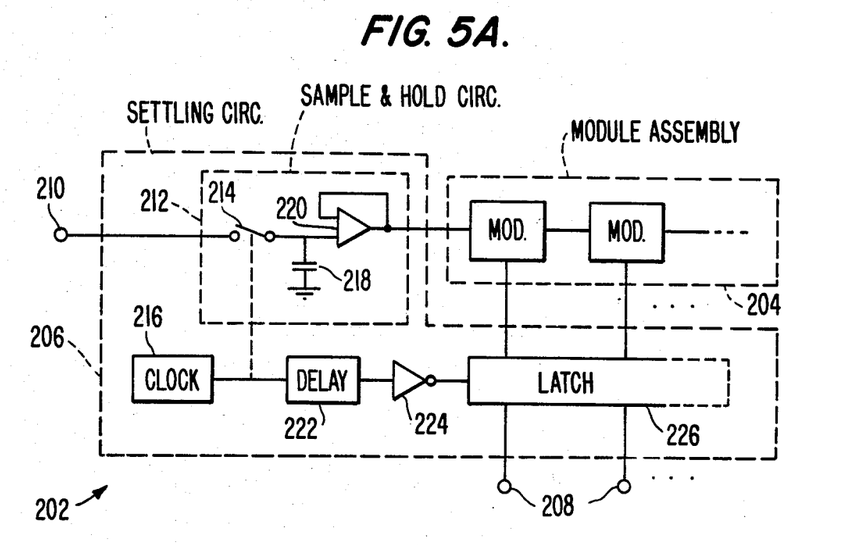
FIG. 5A illustrates an A/D converter formed from an assembly of A/D modules and clock-driven circuitry for avoiding output ripple.

In the A/D converter of FIG. 2, a change in the analog input signal does not result in an absolutely simultaneous change at the output terminal of the modules due to the probagation delay through the various components. Although the A/D converter of FIG. 2 is fast, since it does not rely upon a clock, a change in the analog input voltage may result in an incorrect digital output as the conversion ripples through the series of modules. Although the modules settle rapidly, in some instances the ripple might be undesirable. FIG. 5A illustrates an analog/digital converter 202 having an assembly 204 of modules and settling circuitry 206 for avoiding ripple at digital output terminals 208. As is apparent from the dots, assembly 204 has an indefinite number of modules, depending upon the number of output bits desired. In FIG. 5A, an analog input signal is applied at terminal 210. Sample-and-hold circuit 212 has a switch 214 which is closed when the clock signal from clock 216 is "high." The voltage across capacitor 218 rapidly equals the potential of the input signal, and this potential is provided as an input to assembly 204 by voltage follower 220 even when the clock signal opens switch 214. It will be apparent that the input signal is sampled when the clock signal is high and held when it is low.

Figure 5B:
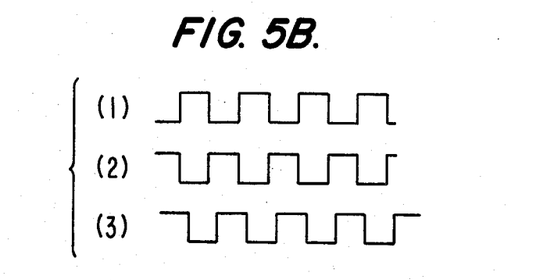
FIG. 5B is a timing diagram used to explain the operation of the circuit of FIG. 5A.

With continuing reference to FIG. 5A, the clock signal is also provided as an input to delay circuit 222, and the delayed output is inverted by inverter 224. The output of inverter 224 is connected to latch 226, which transfers the output of assembly 204 to terminals 208 at the positive-going edge of the output of inverter 224. Row 1 in FIG. 5B illustrates the clock signal. Row 2 illustrates the inverted clock signal. Finally, row 3 (showing the output of inverter 224) illustrates the delayed inverted clock signal. It will be observed that the positive-going edge in row 3 lies well within the "hold" portion of sample-and-hold circuit 212, so that the circuitry of assembly 204 has had ample time to settle by the time the digital output on terminals 208 is updated.

Figure 6A:
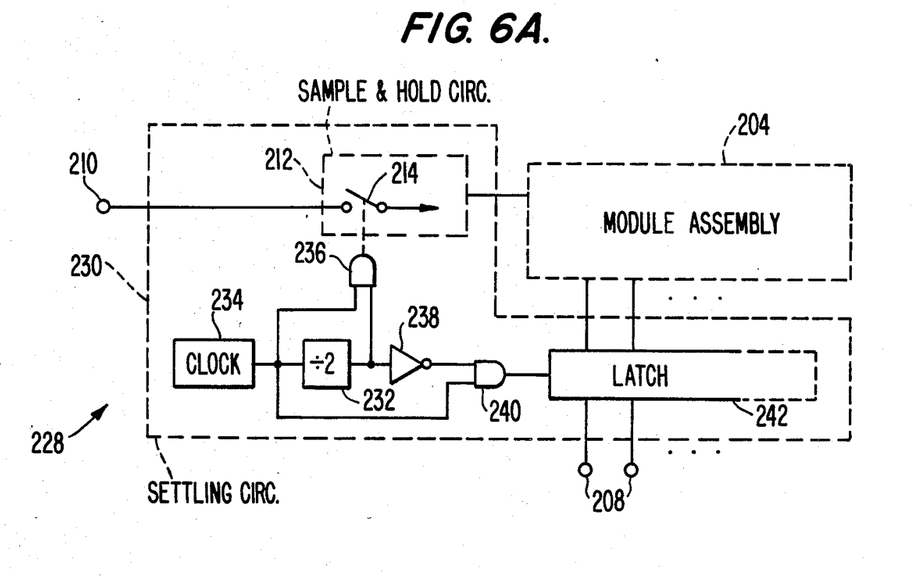
FIG. 6A is an A/D converter formed from an assembly of A/D modules and different clock-driven circuitry for avoiding output ripple.
Figure 6B:
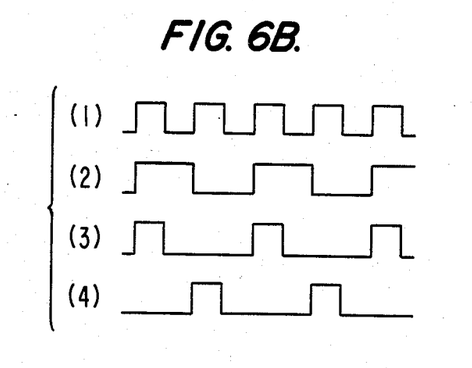
FIG. 6B is a timing diagram used to explain the operation of the circuit of FIG. 6A.

FIG. 6A illustrates another A/D converter 208 employing an assembly of modules 204. Settling circuitry 230, however, is different from the settling circuitry 206 illustrated in FIG. 5A. In FIG. 6A, divide-by-2 circuit 232 receives the output of the clock 234. One input of AND gate 236 receives the clock signal while the other input receives the divided clock signal. The output of AND gate 236 is used to operate switch 214 in sample-and-hold circuit 212. Inverter 238 is connected to divider 232 and provides one input for AND gate 240. The other input of gate 240 is connected to clock 234. The output of assembly 204 is provided as an input to latch 242 and is transferred to output terminals 208 at the time determined by gate 240. In FIG. 6B row 1 illustrates the clock signal, while row 2 represent the divided clock signal. Row 3 represents the output of gate 236, and it will be observed that the analog input signal is repeatedly sampled for a short interval and held for a long interval. This "hold" period occurs when the signal at row 3 in FIG. 6B is at the "low" level. Row 4 in FIG. 6B illustrates the output of gate 240. It will be apparent that any ripple at the output of assembly 204 has disappeared by the time the output thereof is transferred to digital output terminals 208.

It has previously been observed that the reliance upon clocks in various prior art analog/digital conversion schemes tends to slow the conversion process. While the A/D converters 202 and 228 of FIGS. 5A and 6A, respectively, use clock signals, the clock signals are not relied upon as an integral part of the conversion process. Instead, clock signals are merely used to avoid ripple. Even the circuit of FIG. 6A, which is slower than the circuit of FIG. 5A, provides a digital output every other clock pulse. There may be purists, however, who would like to avoid clocks altogether; this is accomplished by A/D converter 244 illustrated in FIG. 7.

Figure 7:
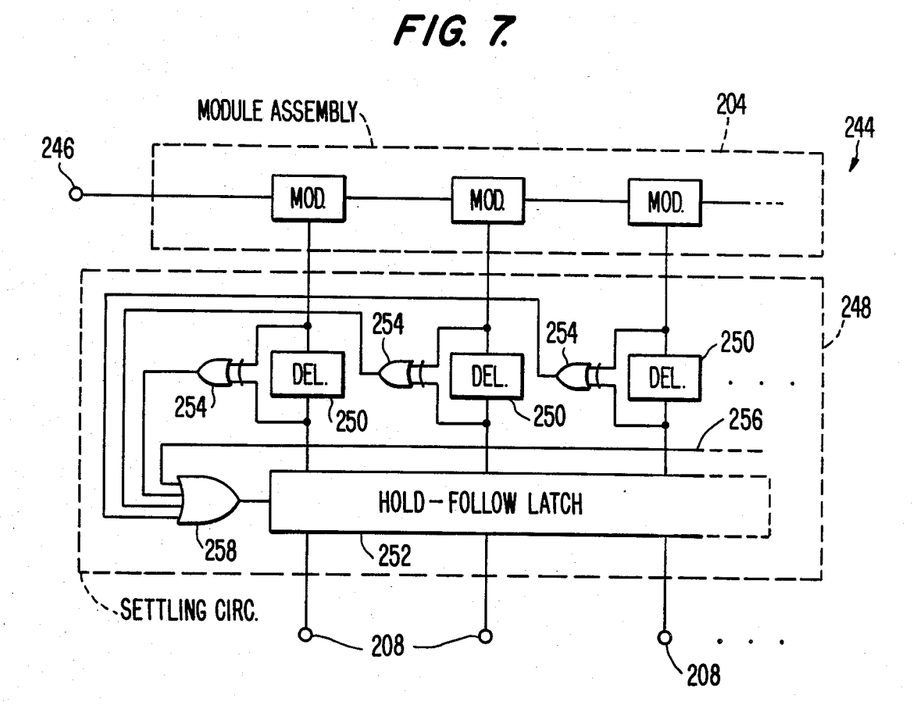
FIG. 7 illustrates an A/D converter formed from an assembly of A/D modules and circuitry for avoiding output ripple which does not require a clock signal.

In FIG. 7, assembly of modules 204 receives an analog input signal at terminal 246 and provides an equivalent digital output to settling circuit 248. As before, the dots in FIG. 7 indicate that the word length is not limited to three bits but may instead be expanded. In FIG. 7, each binary output signal is delayed by a delay circuit 250 before being supplied an input to latch 252. As a result of these delays, the potential on one side of a circuit 250 will be opposite from the potential on the other side for a brief period when the corresponding output bit from assembly 204 changes. Accordingly, the outputs of exclusive OR gates 254 will become "high," for a period determined by delay circuits 250, each time the corresponding bit from assembly 204 changes. Lead 256 is used to indicate symbolically the output of additional exclusive OR gates associated with the outputs of further A/D modules. The delays are selected so that the module after the one which has changed will have ample time to settle; that is, the delay is greater than the propagation time through any one stage. The outputs of the various gates 254 are provided as inputs to OR gate 258, which is connected to a control input of latch 252. It will be apparent that the output of gate 258 is "high" for the entire time that a change is rippling through assembly 204. Latch 252 is a storage latch of the type that holds its present content when the control voltage is "high" and follows the input signal when the control input is "low." Accordingly, the digital signal on output terminals 208 is not updated until all of the modules in assembly 204 have settled.

It should not be imagined that the present invention is limited to A/D converters made of A/D modules having a single converter therein. It is sometimes advantageous to reduce the numbers of modules employed by using modules which produce more than one digital output bit. The reason for this is that differential amplifiers are widely used in subtraction circuits and times-2 amplifiers such as circuits 142 and 144 in FIG. 2. Although modern differential amplifier designs and compensating circuits have achieved remarkable improvements, offset errors remain a troublesome reality when differential amplifiers are used. Since such offset errors are cumulative in a series-connected assembly of A/D modules such as converter 115 in FIG. 2, and since it is frequently desirable to achieve digital words having a relatively large number of bits, it is advantageous to reduce the cumulative offset error attributable to each additional bit of resolution.

Figure 8:
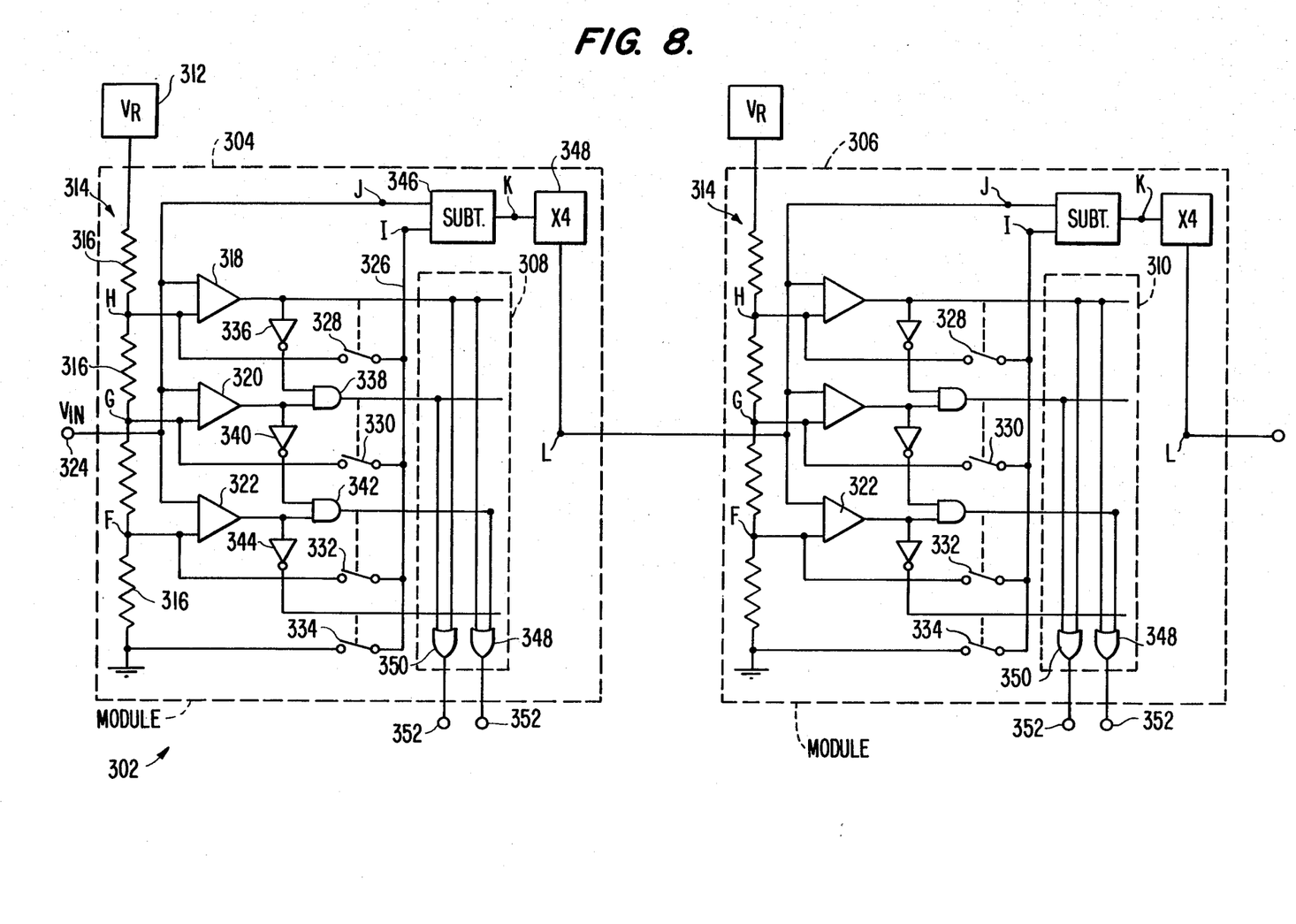
FIG. 8 illustrates a 4-bit A/D converter using a pair of 2-bit modules.

In FIG. 8 a four-bit A/D converter 302 is provided by assembly of two two-bit modules 304 and 306. Reference voltage source 312 for module 304 provides a reference voltage $V_R$ for biasing network 314, which is connected between source 312 and ground. This biasing network 314 provides a plurality of equally-spaced biasing potentials. In the circuit of FIG. 8 these biasing potentials are provided by a voltage divider made of series-connected resistors 316 although, as noted above, the biasing potentials could alternatively be obtained by other circuitry. Comparators 318, 320, and 322 each have one input terminal which receives a corresponding biasing potential. The second terminal of each comparator is electrically connected to analog input terminal 324. Conductor 326 connects one input of subtraction circuit 346 to one side of each of switches 328, 330, 332, and 334. The remaining side of switch 334 is connected to ground; the remaining side of switch 332 is connected to point F on biasing network 314; the remaining side of switch 330 is connected to point G; and the remaining side of switch 328 is connected to point H. Switch 328 is closed when the output of comparator 318 is "high," indicating that $V_{in}$ is equal to or exceeds the potential at point H. Inverter 336 is connected to the output of comparator 318 and inverts the output thereof before supplying it to one input terminal of AND gate 338. Since the remaining input of gate 338 is connected to the output of inverter 320, it will be apparent that AND gate 338 will be "ON" only when the output of comparator 320 is "high" while the output of comparator 318 is simultaneously "low." That is, AND gate 338 will be ON only when $V_{in}$ equals or exceeds the potential at point G on the biasing network but is lower than the potential at point H. Switch 330 is closed when gate 338 is "ON". Inverter 340 is connected to the output of comparator 320 and inverts the output thereof before applying it to one input of AND gate 342. The remaining input of gate 342 is connected to the output of comparator 322, so that AND gate 342 turns ON only when the output of comparator 322 is "high," while the output of comparator 320 is simultaneously "low." In short, AND gate 342 turns ON and closes switch 332 only when $V_{in}$ equals or exceeds the potential at point F on biasing network 314 but does not reach the potential at point G. Inverter 344 is connected to the output of comparator 322 and closes switch 334 when $V_{in}$ does not reach the potential at point F.

With continuing reference to module 304 in FIG. 8, it will be apparent that as $V_{in}$ rises, the potential at point I will be 0 until $V_{in}$ reaches the potential at point F. Thereafter the potential at point I will be $\frac{1}{4}$ of $V_R$ (the resistors 316 being equal in value) until $V_{in}$ reaches the potential at G. At that point the potential at point I becomes $\frac{1}{2}$ of $V_R$. The potential at point I remains unchanged until $V_{in}$ reaches the potential of point H, whereupon the potential at point I becomes $\frac{3}{4}$ $V_R$. Subtraction circuit 346 subtracts the potential at point I from the potential at point J, which is equal to $V_{in}$. Since the potential at point J never exceeds the potential at point I by more than $\frac{1}{4}$ the value of $V_R$, it is apparent that the difference at point K may range from 0 volts to almost $\frac{1}{4}$ $V_R$. After multiplication by a factor of 4 by circuit 348, the remainder signal at point L may range from 0 to almost $V_R$.

With continuing reference to FIG. 8, encoder circuits 308 and 310 receive the outputs from comparator 318, gate 338, gate 342, and inverter 344, and produce binary signals as a result. Encoder circuits 308 and 310 each include a first OR gate 348 and a second OR gate 350. The proper connections can be perceived from the following table.

TABLE

| Decimal | Binary First Two Digits | Binary Last Two Digits |
|---|---|---|
| 0 | 00 | 00 |
| 1 | 00 | 01 |
| 2 | 00 | 10 |
| 3 | 00 | 11 |
| 4 | 01 | 00 |
| 5 | 01 | 01 |
| 6 | 01 | 10 |
| 7 | 01 | 11 |
| 8 | 10 | 00 |
| 9 | 10 | 01 |
| 10 | 10 | 10 |
| 11 | 10 | 11 |
| 12 | 11 | 00 |
| 13 | 11 | 01 |
| 14 | 11 | 10 |
| 15 | 11 | 11 |

The four output terminals 352 of four-bit A/D converter 302 can have a total of 16 different states, as indicated in the Table. As is apparent from the Table, the last two digits (that is, the signals at terminals 352 of module 306) are repeated four times. In each of these repetitions OR gate 348 is turned ON if the input potential to the module (the potential at point L in module 304) equals or exceeds the potential at point F but does not reach the potential at point G on biasing network 314 in module 306, or if the input potential equals or exceeds the potential at point H. Similarly, for each of the four groupings it is apparent from the Table that second OR gate 350 in module 306 is turn ON if the input potential to the module equals or exceeds the potential at point G. The Table similarly indicates the connections within encoder circuit 308 of the first module 304. OR gate 348 in encoder 308 is turned ON if $V_{in}$ equals or exceeds the potential at point F on the biasing network 314 in module 304 but does not reach the potential at point G, or if $V_{in}$ equals or exceeds the potential at point H. Similarly, OR gate 350 in module 304 is turned ON if $V_{in}$ equals or exceeds the potential at point G on network 314 in module 304. It will be noted that the output of inverter 344 is not connected to either OR gate in either module, but this is not a general result (for example, a five-bit converter made out of two-bit and three-bit modules).

With continuing reference to FIG. 8, an example of the operation of converter 302 will now be described. Assuming that the reference voltage $V_R$ is 10 volts for each module, the scaling factor M equals $V_R/2^n = 10/16$ should be applied to produce a digital output having the correct numerical relationship to the input. Accordingly, a digital equivalent of a nine volt analog signal would be derived by applying $90/16 = 5.625$ volts to input terminal 324 as $V_{in}$. In each module the potential at point F is 2.5 volts, the potential at point G is 5 volts, and the potential at point H is 7.5 volts. Accordingly, in module 304 comparator 320 is the highest comparator to turn ON, so that AND gate 338 is ON, comparator 318 is OFF, and AND gate 342 is OFF. OR gate 350 in module 304 turns ON and gate 348 is OFF, so that the first two digits are 1, 0. Switch 330 is closed, so that the potential at point I in module 304 is 5 volts, while the potential at point J is 5.625 volts, the same as $V_{in}$. The difference at point K is 0.625 volts which, when multiplied by 4, results in a remainder signal at point L of 2.5 volts. This value is supplied as an input to the second module 360. Since 2.5 volts equals the potential at point F on biasing network 314 in module 306, comparator 322 is the highest one which turns ON. It is apparent that the last two digits of the output are 0, 1 so that the entire output of converter 302 is 1001 (decimal 9).

Figure 9A:
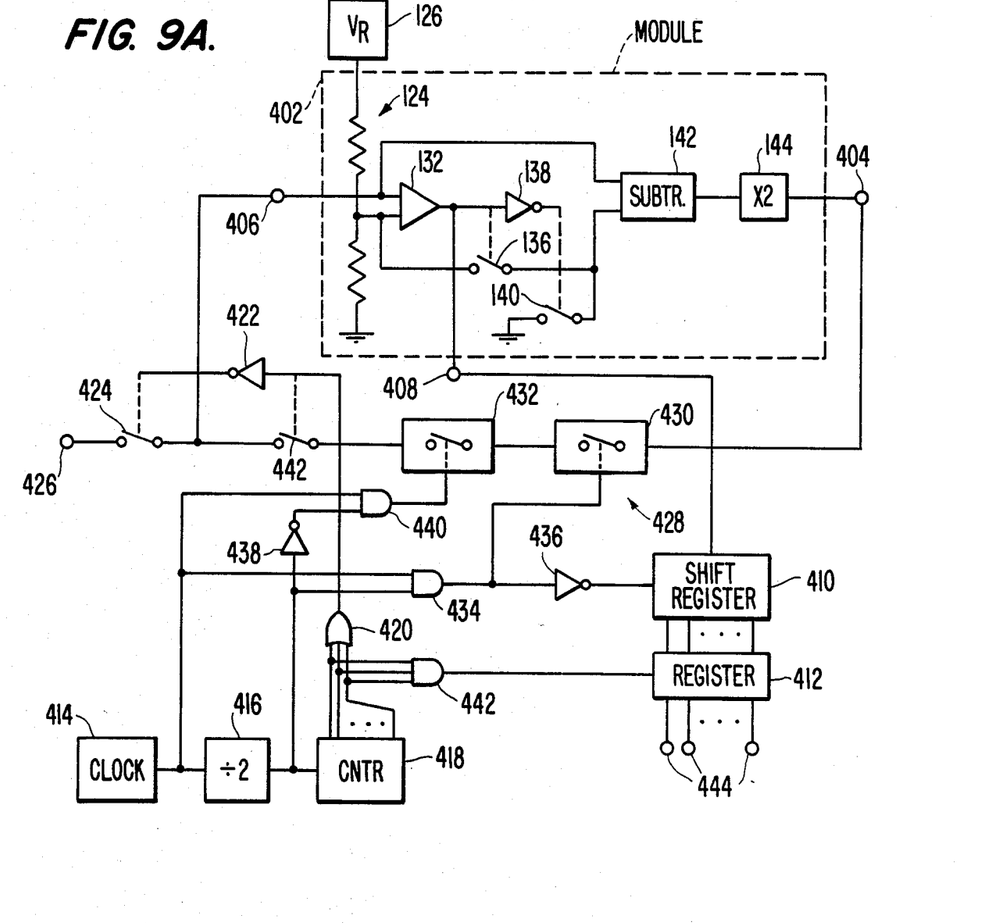
FIG. 9A illustrates an A/D converter wherein the remainder signal is recirculated through the same A/D module.

Turning now to FIG. 9A, module 402 is the same general type as the modules used in the A/D converter 115 of FIG. 2. However, in FIG. 9A a series of modules is not used; instead, the same module is used and successive remainder signals from remainder terminal 404 are circulated back to input terminal 406 until the desired number of bits have appeared at output bit terminal 408. These output bits are stored in shift register 410 until a complete digital work has been assembled and the output is transferred to register 412 to serve as the digital output.

Figure 9B:
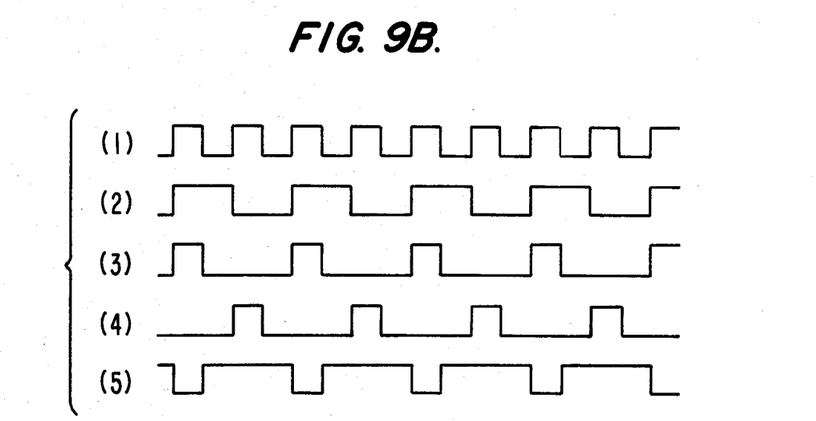
FIG. 9B is a timing diagram used to explain the operation of the circuit of FIG. 9A.

With reference next to both FIGS. 9A and 9B, clock 414 produces a clock signal as illustrated in row 1 of FIG. 9B. These clock signals are supplied as an input to divided-by-two divider 416, whose output is illustrated in row 2 of FIG. 9B. A binary counter 418 counts from 00 ... 0 to 111 ... 1, and on the next signal from divider 416 overflows back to 00 ... 0. OR gate 420 has inputs responsive to the output of counter 418, and it will be apparent that the output of gate 420 is "high" for all counts except the overflow count 00 ... 0. Accordingly, when counter 418 overflows, the output of inverter 422 goes "high" and closes switch 424. This permits an analog signal on A/D converter input terminal 426 to reach terminal 406 of module 402. Very rapidly a remainder term is generated for storage in analog memory 428, formed by first and second sample-and-hold circuits 430 and 432.

With continuing reference to FIGS. 9A and 9B, AND gate 434 has one input connected to the output of divider 416 and a second input connected to the output of clock 414. Row 3 in FIG. 9B illustrates the output of gate 434. This output is used to close the switch in sample-and-hold circuit 430, thereby storing the remainder signal for a relatively long "hold" period (the "low" portion of the signal illustrated in row 3 of FIG. 9B). The output of gate 434 is inverted by inverter 436, which has an output as illustrated in row 5 of FIG. 9B. The output bit from terminal 408 is shifted into the shift register at the positive-going edge of the output from inverter 436.

With continuing reference to FIG. 9A and 9B, the input of inverter 438 is connected to the output of divider 416 and the output of inverter 438 is connected to one input of AND gate 440. The remaining input of AND gate 440 is connected to clock 414. The output of gate 440 is illustrated in row 4 of FIG. 9B. During the "high" portion of the signal in row 4, sample-and-hold circuit 432 samples the signal held by sample-and-hold circuit 430, and during the "low" portion the signal is held and provided to one side of switch 442. Accordingly, the remainder signal from terminal 404 is available at switch 442 when the count in counter 418 is incremented, thereby closing switch 442 and simultaneously opening switch 424. Since OR gate 420 is connected to all of the outputs of counter 418, switch 442 remains closed until the counter overflows again. In this way a remainder term is continuously derived and circulated through module 402, each time providing a new output bit at terminal 408 for storage in shift register 410. When the content of counter 418 reaches 11 ... 1 AND gate 442 turns ON, and the content of shift register 410 is transferred to register 412 as a digital output signal on output terminals 444. Counter 418 is then incremented to the overflow state of 00 ... 0 and the process begins anew.

I claim:

1. An analog/digital converter for receiving an analog signal and converting it to parallel digital form, comprising:
a first ripple-through analog/digital module which includes
first biasing means for establishing at least three different first biasing potentials, said first biasing network means including at least one forward-biased semiconductor element,
first comparator means for comparing said at least three first biasing potentials and said analog signal, said first comparator means including at least three comparators each having one input responsive to said analog signal and another input responsive to a respective one of said at least three first biasing potentials,
first bit output means responsive to the output of said first comparator means for providing a pluralilty of parallel digital output bits from said first module, said first bit output means operating substantially immediately except for propagation delay,
first switching means responsive to the output of said first comparator means for selecting, from among said at least three first biasing potentials and ground potential, the largest potential that does not exceed the potential of said analog signal, said first switching means operating substantially immediately except for propagation delay, and
means responsive to the potential selected by said first switching means and to said analog signal for producing, substantially immediately except for propagation delay, a first remainder signal that is proportional in magnitude to the difference between said analog signal and the potential selected by said first switching means; and
means connected to said first module for using said first remainder signal to generate at least one additional digital output bit.

2. The analog/digital converter of claim 1, wherein said means connected to said first module comprises a second ripple-through module which includes second biasing means for establishing at least one second biasing potential, second comparator means for comparing said at least one second biasing potential and said first remainder signal, second bit output means responsive to the output of said second comparator means for providing at least one output bit from said second module, said second bit output means operating substantially immediately except for propagation delay, second switching means resonsive to the output of said second comparator means for selecting, from among said at least one second biasing potential and ground, the largest potential that does not exceed the potential of said first remainder signal, said second switching means operating substantially immediately except for propagation delay, and means responsive to the potential selected by said second switching means and to said first remainder signal for producing, substantially immediately except for propagation delay, a second remainder signal that is proportional in magnitude to the difference between said first remainder signal and the potential selected by said second switching means; and means connected to said second module for using said second remainder signal to generate at least one further digital output bit.

3. The analog/digtal converter of claim 2, wherein said means connected to said second module comprises a third ripple-through module which includes third biasing means for establishing at least one third biasing potential, third comparator means for comparing said at least one third biasing potential and said second remainder signal, third bit output means responsive to the output of said third comparator means for providing at least one output bit from said third module, said third bit output means operating substantially immediately except for propagation delay, third switching means responsive to the output of said third comparator means for selecting, from among said at least one third biasing potential and ground potential, the largest potential that does not exceed the potential of said second remainder signal, said second switching means operating substantially immediately except for propagation delay, and means responsive to the potential selected by said third switching means and to said second remainder signal for producing, substantially immediately except for propagation delay, a third remainder signal that is proportional in magnitude to the difference between said second remainder signal and the potential selected by said third switching means; and means connected to said third module for using said third remainder signal to generate at least one more output bit.

4. The analog/digital converter of claim 3, wherein said means connected to said third module comprises at least one additional ripple-through module, said at least one additional module having the same circuitry as at least one of said first, second and third modules.

5. The analog/digital converter of claim 1, wherein said means connected to said first module for using said first remainder signal to generate at least one additional output bit comprises recirculation means for replacing said analog signal applied to said first module with said first remainder signal generated by said first module, so that said first remainder signal is provided to said first comparator means.

6. The analog/digital converter of claim 5, wherein said means for replacing said analog signal comprises analog memory means for storing said first remainder signal and switch means for switching the content of said analog memory means to an input of said first comparator means.

7. The analog/digital converter of claim 6, wherein said means connected to said first module for using said first remainder signal to generate at least one additional output bit additionally comprises a shift register connected to said first bit output means.

8. The analog/digital converter of claim 1, further comprising means for updating said plurality of output bits from said first module and said at least one additional output bit at substantially the same time.

9. The analog/digital converter of claim 8, wherein said means for updating comprises sample-and-hold means for repeatedly receiving said analog signal and holding it prior to comparison by said first comparator means, and latch means cooperating with said sample-and-hold means for repeatedly receiving said plurality of output bits and said at least one additional output bit at a time after said analog signal was held.

10. The analog/digital converter of claim 8, wherein said means for updating comprises means for detecting when any of said plurality of output bits and said at least one additional output bit changes, and latch means for simultaneously receiving said plurality of output bits and said at least one additional output bit at a time when no changes are taking place.

11. An analog/digital converter, comprising:

a plurality of series-connected analog/digital ripple-through modules, each module including biasing means for establishing a plurality of biasing potentials, said biasing means including at least one forward biased semiconductor element, comparator means for comparing said plurality of biasing potentials and an input signal, said comparator means including a plurality of comparators each having a first input responsive to said input signal and a second input responsive to a respective one of said biasing potentials, bit output means responsive to the output of said comparator means for providing a plurality of parallel digital output bits, said bit output means operating substantially immediately except for propagation delay, switching means responsive to the output of said comparator means for selecting, from among said plurality of biasing potentials and ground potential, the largest potential that does not exceed the potential of said input signal, said switching means operating substantially immediately except for propagation delay, and means responsive to the potential selected by said switching means and to said input signal for producing, substantially immediately except for propagation delay, a remainder signal that is proportional in magnitude to the difference between said input signal and the potential selected by said switching means, wherein said input signal compared by the comparator means of the first of said plurality of series-connected modules is an analog signal and wherein the input signal compared by the comparator means of each of the remainder of said series-connected modules is the remainder signal from the module proceeding it in the series.

12. The analog/digital converter of claim 11, further comprising means for updating the plurality of digital output bits from each module at substantially the same time.

13. The analog/digital converter of claim 11 or 12 wherein, for each of said plurality of series-connected modules, said switching means comprises a plurality of switches, each connected to the second input of a respective comparator.

14. The analog/digital converter of claim 13 wherein, for each of said plurality of series-connected modules, said means responsive to the potential selected by said switching means comprises a subtraction circuit.

15. The analog/digital converter of claim 14 wherein, for each of said plurality of series-connected modules, said means responsive to the potential selected by said switching means additionally comprises an amplifier which multiples the output of said subtraction circuit by an integer greater than one.

16. The analog/digital converter of claim 12, wherein the means for updating the plurality of digital output bits from each module comprises sample-and-hold means for repeatedly receiving said analog signal and holding it prior to comparison by the comparator means of the first of said plurality of series-connected modules, and latch means cooperating with said sample-and-hold means for repeatedly receiving the plurality of output bits from each of said plurality of modules at a time after said analog signal was held.

17. The analog/digital converter of claim 12, wherein the means for updating the plurality of digital output bits from each module comprises detection means for detecting when an output bit from any of said plurality of modules changes, and latch means for simultaneously receiving said output bits at a time when no changes are taking place.

18. The analog/digital converter of claim 17, wherein said detection means comprises, for each output bit, a delay circuit connected between said latch means and the bit output means of the corresponding module, and an exclusive-OR gate having an input connected to the input of the delay circuit and an input connected to the output of the delay circuit.

19. A method for converting an analog signal to a digital signal having a predetermined number of parallel bits, said method comprising the steps of:
(a) in a first module, selecting one out of a plurality of predetermined potentials by comparing said analog signal to at least one of said predetermined potentials;
(b) in said first module, providing at least one digital output bit based upon the predetermined potential selected in step (a);
(c) in said first module, generating a remainder signal by finding the difference between said analog signal and the predetermined potential selected in step (a);
(d) in an additional module, selecting one out of a plurality of predetermined potentials by comparing said remainder signal to at least one of said predetermined potentials;
(e) in said additional module, providing at least one additional digital output bit based upon the predetermined potential selected in step (d);
(f) in said additional module, generating a new remainder signal by finding the difference between the previous remainder signal and the predetermined potential selected in step (d);
(g) repeating steps (d) through (f) until the predetermined number of bits is achieved, step (f) being unnecessary in the final repetition; and
(h) simultaneously storing said predetermined number of bits, at a time after all of them have been generated by steps (a) through (g), by detecting when an output bit from any module changes and delaying the storage of all of the bits until a time when no changes are taking place.

20. A method for converting an analog signal to a digital signal having a predetermined number of parallel bits, said method comrising the steps of:
(a) in a module, selecting one out of a plurality of predetermined potentials by comparing said analog signal to at least one of said predetermined potentials;
(b) in said module, providing at least one digital output bit based upon the predetermined potential selected in step (a);
(c) in said module, generating a remainder signal by finding the difference between said analog signal and the predetermined potential selected in step (a); and
(d) using said module to repeat steps (a) through (c), with the remainder signal generated in each repetition being used in step (a) in lieu of the analog signal, until the predetermined number of bits is achieved, for each repetition the step (d) including the steps of storing the remainder signal in a first sample-and-hold circuit in response to a clock and subsequently storing the remainder signal in a second sample-and-hold circuit in response to said clock.

21. An analog/digital converter, comprising:
a plurality of series-connected analog/digital ripple-through modules, each module including
biasing means for establishing at least one biasing potential,
comparator means for comparing said at least one biasing potential and an input signal,
bit output means responsive to the output of said comparator means for providing at least one digital output bit, said bit output means operating substantially immediately except for propagation delay,
switching means responsive to the output of said comparator means for selecting, for among said at least one biasing potenital and ground potential, the largest potential that does not exceed the potential of said input signal, said switching means operating substantially immediately except for propagation delay, and
means responsive to the potential selected by said switching means and to said input signal for producing, substantially immediately except for propagation delay, a remainder signal that is proportional in magnitude to the difference between said input signal and the potential selected by said switching means; and updating means for updating the at least one digital output bit from each module at substantially the same time, said updating means including sample-and-hold means for repeatedly receiving said analog signal and holding it prior to comparison by the comparator means of the first of said plurality of series-connected modules, and latch means cooperating with said sample-and-hold means for repeatedly receiving the at least one output bit from each of said plurality of modules at a time after said analog signal was held, said latch means providing a parallel digital output, wherein said input signal compared by the comparator means of the first of said plurality of series-connected modules is an analog signal and wherein the input signal compared by the comparator means of each of the remainder of said series-connected modules is the remainder signal from the module proceeding it in the series.

22. The analog/digital converter of claim 21 wherein, for each of said plurality of series-connected modules, said biasing means establishes one biasing potential, said comparator means comprises a comparator having a first input responsive to said input signal and a second input responsive to said biasing potential, said bit output means comprises a conductor connected to the output of said comparator, and said switching means comprises a first means for applying said biasing potential to said means responsive to the potential selected by said switching means when the output of said comparator is in a first state and means for applying a ground potential to said means responsive to the potential selected by said switching means when the output of said comparator is in a second state.

23. The analog/digital converter of claim 22 wherein, for each of said plurality of series-connected modules, said means responsive to the potential selected by said switching means comprises a subtraction circuit.

24. The analog/digital converter of claim 33 wherein, for each of said plurality of series-connected modules, said means responsive to the potential selected by said switching means additionally comprises an amplifier which multiplies the output of said subtraction circuit by two.

25. An analog/digital converter, comprising:
a plurality of series-connected analog/digital modules, each module including
 biasing means for establishing at least one biasing potential,
 comparator means for comparing said at least one biasing potential and an input signal,
 bit output means responsive to the output of said comparator means for providing at least one digital output bit,
 switching means responsive to the output of said comparator means for selecting, from among said at least one biasing potential and ground potential, the largest potential that does not exceed the potential of said input signal, and
 means responsive to the potential selected by said switching means and to said input signal for producing a remainder signal that is proportional in magnitude to the difference between said input and the potential selected by said switching means; and
updating means for updating the at least one digital output bit from each module at substantially the same time, said updating means including detection means for detecting when an output bit from any of said plurality of modules changes, and latch means for simultaneously receiving said output bits at a time when no changes are taking place, said latch means providing a parallel digital output, wherein said input signal compared by the comparator means of the first of said plurality of series-connected modules is an analog signal and wherein the input signal compared by the comparator means of each of the remainder of said series-connected modules is the remainder signal from the modules proceeding it in the series.

26. The analog/digital coverter of claim 25, wherein said detection means comprises, for each output bit, a delay circuit connected between said latch means and the bit output means of the corresponding module, and a gate having an input connected to the input of the delay circuit and an input connected to the output of the delay circuit.

27. The analog/digital converter of claim 26 wherein, for each of said plurality of series-connected modules, said biasing means establishes one biasing potential, said comparator means comprises a comparator having a first input responsive to said input signal and a second input responsive to said biasing potential, said bit output means comprises a conductor connected to the output of said comparator, and said switching means comprises a first means for applying said biasing potential to said means responsive to the potential selected by said switching means when the output of said comparator is in a first state and means for applying a ground potential to said means responsive to the potential selected by said switching means when the output of said comparator is in a second state.

28. The analog/digital converter of claim 27 wherein, for each of said plurality of series-connected modules, said means responsive to the potential selected by said switching means comprises a subtraction circuit.

29. The analog/digital converter of claim 28 wherein, for each of said plurality of series-connected modules, said means responsive to the potential selected by said switching means additionally comprises an amplifier which multiplies the output of said subtraction circuit by two.

30. An analog/digital coverter for receiving an analog signal and converting it to parallel digital form, comprising:
a first ripple-through analog/digital module which includes
 first biasing means for establishing at least three different first biasing potentials,
 first comparator means for comparing said at least three first biasing potentials and said analog signal, said first comparator means including at least three comparators each having one input responsive to said analog signal and another input responsive to a respective one of said at least three first biasing potentials,
 first bit output means responsive to the output of said first comparator means for providing a plurality of parallel digital output bits from said first module, said first bit output means operating substantially immediately except for propagation delay,
 first switching means responsive to the output of said first comparator means for selecting, from among said at least three first biasing potentials and ground potential, the largest potential that does not exceed the potential of said analog signal, said first switching means operating substantially immediately except for propagation delay, and means responsive to the potential selected by said first switching means and to said analog signal for producing, substantially immediately except for propagation delay, a first remainder signal that is proportional in magnitde to the difference between said analog signal and the potential selected by said first switching means;

means connected to said first module for using said first remainder signal to generate at least one additional digital output bit; and means for updating said plurality of output bits from said first module and said at least one additional output bit at substantially the same time.

31. The analog/digital converter of claim 30, wherein said means connected to said first module comprises a second ripple-through module which includes second biasing means for establishing at least one second biasing potential, second comparator means for comparing said at least one second biasing potential and said first remainder signal, second bit output means responsive to the output of said second comparator means for providing at least one output bit from said second module, said second bit output means operating substantially immediately except for propagation delay, second switching means responsive to the output of said second comparator means for selecting, from among said at least one second biasing potential and ground, the largest potential that does not exceed the potential of said first remainder signal, said second switching means operating substantially immediately except for propagation delay, and means responsive to the potential selected by said second switching means and to said first remainder signal for producing, substantially immediately except for propagation delay, a second remainder signal that is proportional in magnitude to the difference between said first remainder signal and the potential selected by said second switching means; and means connected to said second module for using said second remainder signal to generate at least one further digital output bit.

32. The analog/digital converter of claim 31, wherein said means connected to said second module comprises a third ripple-through module which includes third biasing means for establishing at least one third biasing potential, third comparator means for comparing said at least one third biasing potential and said second remainder signal, third bit output means responsive to the output of said third comparator means for providing at least one output bit from said third module, said third bit output means operating substantially immediately except for propagation delay, third switching means responsive to the output of said third comparator means for selecting, from among said at least one third biasing potential and ground potential, the largest potential that does not exceed the potential of said second remainder signal, said second switching means operating substantially immediately except for propagation delay, and means responsive to the potential selected by said third switching means and to said second remainder signal for producing, substantially immediately except for propagation delay, a third remainder signal that is proportional in magnitude to the difference between said second remainder signal and the potential selected by said third switching means; and means connected to said third module for using said third remainder signal to generate at least one more output bit.

33. The analog/digital converter of claim 32, wherein said means connected to said third module comprises at least one additional ripple-through module, said at least one additional module having the same circuitry as at least one of said first, second and third modules.

34. The analog/digital converter of claim 30, wherein said first biasing means comprises a plurality of resistors series-connected between ground and means for providing a reference potential.

35. The analog/digital converter of claim 30, wherein said means for updating comprises sample-and-hold means for repeatedly receiving said analog signal and holding it prior to comparison by said first comparator means, and latch means cooperating with said sample-and-hold means for repeatedly receiving said plurality of output bits and said at least one additional output bit at a time after said analog signal was held.

36. The analog/digital converter of claim 30, wherein said means for updating comprises means for detecting when any of said plurality of output bits and said at least one additional output bit changes, and latch means for simultaneously receiving said plurality of output bits and said at least one additional output bit at a time when no changes are taking place.

37. An analog/digital converter, comprising:

a plurality of series-connected analog/digital ripple-through modules, each module including biasing means for establishing a plurality of biasing potentials, comparator means for comparing said plurality of biasing potentials and an input signal, said comparator means including a plurality of comparators each having a first input responsive to said input signal and a second input responsive to a respective one of said biasing potentials, bit output means responsive to the output of said comparator means for providing a plurality of parallel digital output bits, said bit output means operating substantially immediately except for propagation delay, switching means responsive to the output of said comparator means for selecting, from among said plurality of biasing potentials and ground potential, the largest potential that does not exceed the potential of said input signal, said switching means operating substantially immediately except for propagation delay, and means responsive to the potential selected by said switching means and to said input signal for producing, substantially immediately except for propagation delay, a remainder signal that is proportional in magnitude to the difference between said input signal and the potential selected by said switching means; and means for updating the plurality of digital output bits from each module at substantially the same time, said means for updating including sample-and-hold means for repeatedly receiving said analog signal and holding it prior to comparison by the comparator means of the first of said series-connected modules, and latch means cooperating with said sample-and-hold means for repeatedly receiving the plurality of output bits from each of said plurality of modules at a time after said analog signal was held, wherein said input signal compared by the comparator means of the first of said plurality of series-connected modules is an analog signal and wherein the input signal compared by the comparator means of each of the remainder of said series-connected modules is the remainder signal from the module proceeding it in the series.

38. The analog/digital converter of claim 37 wherein, for each of said plurality of series-connected modules, said switching means comprises a plurality of switches, each connected to the second input of a respective comparator.

39. The analog/digital converter of claim 38 wherein, for each of said plurality of series-connected modules, said means responsive to the potential selected by said switching means comprises a subtraction circuit.

40. The analog/digital converter of claim 39 wherein, for each of said plurality of series-connected modules, said means responsive to the potential selected by said switching means additionally comprises an amplifier which multiplies the output of said subtraction circuit by an integer greater than one.

41. The analog/digital converter of claim 37, wherein said biasing means comprises at least one forward biased semiconductor element.

42. An analog/digital converter, comprising:
a plurality of series-connected analog/digital ripple-through modules, each module including
biasing means for establishing a plurality of biasing potentials,
comparator means for comparing said plurality of biasing potentials and an input signal, said comparator means including a plurality of comparators each having a first input responsive to said input signal and a second input responsive to a respective one of said biasing potentials,
bit output means responsive to the output of said comparator means for providing a plurality of parallel digital output bits, said bit output means operating substantially immediately except for propagation delay,
switching means responsive to the output of said comparator means for selecting, from among said plurality of biasing potentials and ground potential, the largest potential that does not exceed the potential of said input signal, said switching means operating substantially immediately except for propagation delay, and
means responsive to the potential selected by said switching means and to said input signal for producing, substantially immediately except for propagation delay, a remainder signal that is proportional in magnitude to the difference between said input signal and the potential selected by said switching means; and means for updating the plurality of digital output bits from each module at substantially the same time, said means for updating the plurality of output bits from each module including detection means for detecting when an output bit from any of said plurality of modules changes, and latch means for simultaneously receiving said output bits at a time when no changes are taking place, wherein said input signal compared by the comparator means of the first of said plurality of series-connected modules is an analog signal and wherein the input signal compared by the comparator means of each of the remainder of said series-connected modules is the remainder signal from the module proceeding it in the series.

43. The analog/digital converter of claim 42 wherein, for each of said plurality of series-connected modules, said switching means comprises a plurality of switches, each connected to the second input of a respective comparator.

44. The analog/digital converter of claim 43 wherein, for each of said plurality of series-connected modules, said means responsive to the potential selected by said switching means comprises a subtraction circuit.

45. The analog/digital converter of claim 44 wherein, for each of said plurality of series-connected modules, said means responsive to the potential selected by said switching means additionally comprises an amplifier which multiplies the output of said subtraction circuit by an integer greater than one.

46. The analog/digital converter of claim 42, wherein said detection means comprises, for each output bit, a delay circuit connected between said latch means and the bit output means of the corresponding module, and an exclusive-OR gate having an input connected to the input of the delay circuit and an input connected to the output of the delay circuit.

47. The analog/digital converter of claim 42, wherein said biasing means comprises at least one forward biased semiconductor element.

* * * * *